United States Patent [19]
Le et al.

[11] Patent Number: 6,021,078
[45] Date of Patent: Feb. 1, 2000

[54] FUSE CIRCUIT AND METHOD THEREFOR WHICH MINIMIZES FUSE GROW BACK EFFECT

[75] Inventors: Toan V. Le; Scott A. Taylor, both of Austin, Tex.

[73] Assignees: Motorola, Inc., Schaumburg, Ill.; International Business Machines Corporation, Armonk, N.Y.

[21] Appl. No.: 09/014,389

[22] Filed: Jan. 27, 1998

[51] Int. Cl.[7] .................................................. G11C 7/00
[52] U.S. Cl. ...................................... 365/225.7; 365/200
[58] Field of Search ................................ 365/225.7, 200

[56] References Cited

U.S. PATENT DOCUMENTS

| | | | |
|---|---|---|---|
| 4,446,534 | 5/1984 | Smith | 365/96 |
| 5,301,159 | 4/1994 | Lee | 365/225 |
| 5,384,727 | 1/1995 | Moyal et al. | 365/96 |
| 5,426,614 | 6/1995 | Harward | 365/225.7 |
| 5,818,285 | 10/1998 | Lee et al. | 327/525 |
| 5,896,328 | 4/1999 | Tanizaki et al. | 365/200 |

*Primary Examiner*—David Nelms
*Assistant Examiner*—Hien Nguyen
*Attorney, Agent, or Firm*—Robert L. King

[57] ABSTRACT

A fuse circuit (30) uses circuitry (34, 36, 38) which is coupled between each terminal (A, B) of a fuse (32) for the purpose of maintaining each fuse terminal at the same voltage potential or within a predetermined voltage differential. When copper fuses are implemented, the fuse circuit eliminates the tendency for copper corrosion which may result in growth-back of the copper between the two fuse terminals (A, B). By fixing the voltage at each fuse terminal at a specific potential relative to the other terminal, effects of metal growth-back are eliminated. In another form, a bias scheme is used to place a fixed voltage between the fuse terminals to guarantee a minimum voltage differential across the fuse terminals after the fuse is blown. A differential in the voltage at the fuse terminals is sensed in order to indicate the status of the fuse's conductivity.

20 Claims, 3 Drawing Sheets

FUSE CIRCUIT AND METHOD THEREFOR WHICH MINIMIZES FUSE GROW BACK EFFECT

FIELD OF THE INVENTION

This invention relates generally to semiconductors and more particularly to semiconductor fuses.

BACKGROUND OF THE INVENTION

For many years fuses have been used in semiconductor circuits for a variety of purposes. For example, memory circuits typically use fuses to implement memory redundancy. Word line redundancy hardware exists to replace inoperable bit cells or word lines at manufacturing test. The effect of using memory redundancy is to increase effective yield. The improvement in yield is accomplished by programming fuses or fuse circuits to remain conductive or to become electrically open depending upon what memory circuit is needed.

Another common use of fuse technology in semiconductors is to implement electronic chip identification. Chip identification is accomplished by uniquely identifying the source of each chip including a lot, a wafer, and an X/Y coordinate location on a wafer so that a manufacturer can easily retrieve and report process data for a given integrated circuit. Fuses are used to accomplish this purpose in the same manner as fuses are used in memory redundancy. For example, identification fuses may be implemented in banks of fuses on an integrated circuit. To identify a particular integrated circuit a unique pattern of fuses is left closed and other fuses are made open. Such an identifying pattern of open and closed or conductive fuses creates a fingerprint or identifier for the integrated circuit. Upon assertion of a control signal, the conductivity of such fuses may be readily read out of the integrated circuit and stored in a scanned chain. The scanned information may then be read using any conventional scan test equipment.

Fuses have commonly been implemented in semiconductors with either polysilicon or metal. Metals which have been used in the past include aluminum and tungsten. Regardless of the material used to implement the fuse, programming circuitry is required in order to control whether or not the fuse has been blown and to indicate the status of the fuses conductivity. Such an example of a fuse circuit which is programmable is taught by Frederick Smith in U.S. Pat. No. 4,446,534 entitled "Programmable Fuse Circuit". Semiconductor fuses are typically made nonconductive either by application of a large voltage (relative to power supply voltage magnitude) or by use of laser light. In either event, a circuit is required to indicate the existing status of whether or not the fuse has successfully been made nonconductive. In such circuits it is common to permit a voltage differential to exist between the two terminals of the nonconductive fuse after the fuse has been blown or made non-conductive. The output of the fuse circuit will indicate whether or not the programming operation to blow a fuse was successful. Although initially the programming of fuses was susceptible to reliability problems, many reliability issues associated with programming have been solved so that fuses are very common in memory circuits and other circuits which coordinate with memory devices.

DETAILED DESCRIPTION OF THE DRAWINGS

Figure 1:
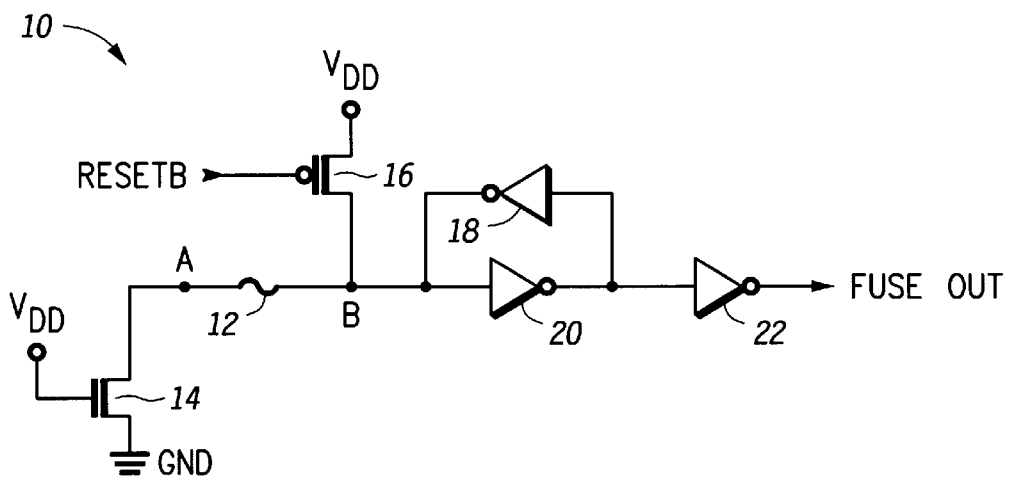
FIG. 1 illustrates, in partial schematic form, a fuse circuit known in the art.

Shown in FIG. 1 is a known fuse circuit 10. Fuse circuit 10 has a fuse 12 connected between a node labeled A and a node labeled B. An N-channel transistor has a drain or first electrode connected to node A, and has a gate or control electrode connected to positive supply voltage $V_{DD}$. Transistor 14 also has a source or second electrode connected to a ground potential. A P-channel transistor 16 has a source connected to supply voltage $V_{DD}$, a gate connected to a signal labeled ResetB, and has a drain connected to node B. An inverter 18 has an input, and has an output connected to node labeled B. An inverter 20 has an input connected to the output of inverter 18 at node B, and has an output connected to the input of inverter 18. An inverter 22 has an input connected to the output of inverter 20, and has an output for providing a signal labeled "FUSE OUT".

In operation, fuse circuit 10 functions to indicate at the output of inverter 22 whether fuse 12 is conductive or non-conductive. If fuse 12 is conductive, the voltage at node A and node B remains the same. Because transistor 14 is also conductive, the voltage at nodes A and B is essentially ground potential. Therefore, the output signal FUSE OUT is also at a ground potential. Inverters 18 and 20 function as a latch wherein inverter 18 is implemented as a weak inverter. Transistor 16 receives an active low control signal labeled ResetB. ResetB is provided as a function of the operation of the general circuitry in which fuse 12 is implemented. ResetB may be a system reset signal or a specific control signal intended just to control the timing of when the FUSE OUT signal is provided. Transistor 16 is designed to be a weak P-channel device as compared to N-channel transistor 14 so that when both transistors 14 and 16 are conductive, the ground signal coupled to node A is stronger than the $V_{DD}$ voltage which is provided via transistor 16 to node B. As a result the overall voltage at nodes A and B is ground rather than $V_{DD}$.

When fuse 12 is blown or made non-conductive, then node B is separated from node A and the ground potential which was at both nodes A and B, is no longer at node B. As a result, the supply voltage $V_{DD}$ is input to inverter 20 and output as a logic high as the FUSE OUT signal at the output of inverter 22.

A disadvantage with fuse circuit 10 is that when fuse 12 is implemented as a metal fuse using copper, and possibly other metals, the voltage differential between node B and node A when fuse 12 is non-conductive creates a potential problem. Because node B is at $V_{DD}$ and node A is at ground, we have observed that fuse 12 is subject to corrosion effects when fuse 12 is implemented as a copper fuse. The corrosion effect manifests itself as a growth between the metal electrodes forming fuse 12. The metal growth is similar to a horizontal stalactite. This metal bridging effect is a result of electrostatic corrosion and also results from the potential voltage difference between nodes A and B. As a result circuit 10 has the disadvantage of possibly indicating a conductive fuse at the output of inverter 22 after fuse 12 has actually been blown or made non-conductive, thereby resulting in a reliability issue. This problem was not observed with prior metal fuses that used aluminum which is less susceptible to corrosion than copper.

Figure 2:
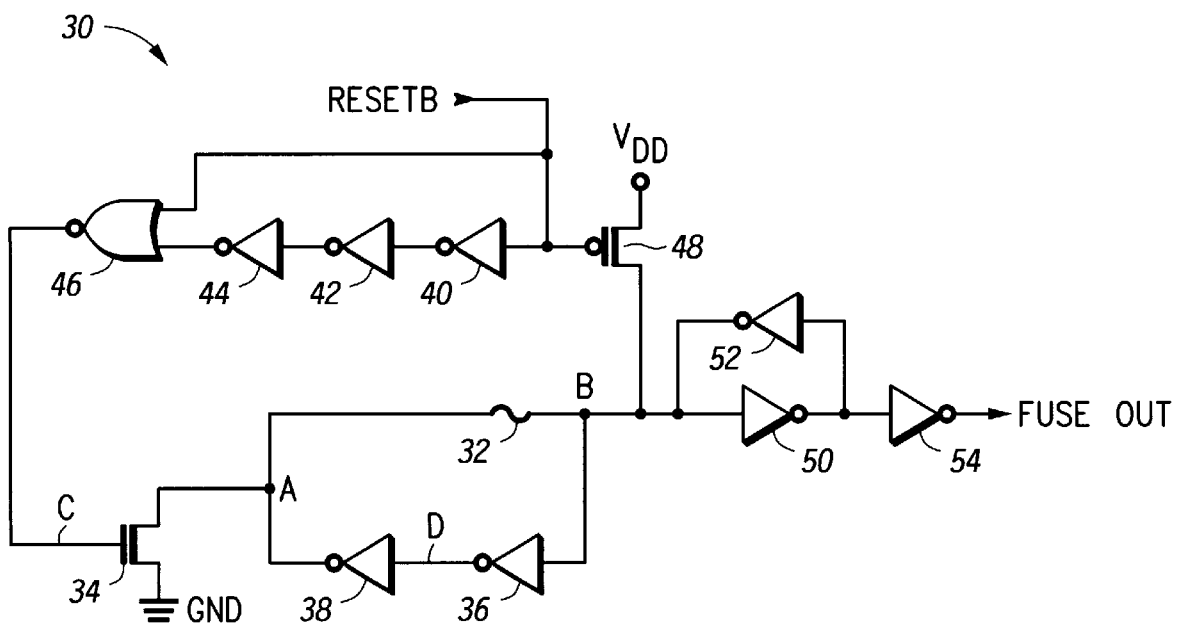
FIG. 2 illustrates, in partial schematic form, a fuse circuit in accordance with the present invention.

Illustrated in FIG. 2 is a fuse circuit 30 in accordance with the present invention. Fuse circuit 30 has a metal fuse 32 which in one form is made of copper. Fuse 32 is placed between a node A and a node B. An N-channel transistor 34 has a drain connected to node A, a gate, and a source connected to a ground voltage terminal. An input of a buffer or an inverter 36 is connected to node B. An output of inverter 36 is connected to an input of a buffer or an inverter 38 which also has an output connected to both node A and the drain of transistor 34. Inverter 38 is implemented with a weakly doped P-channel transistor (not shown) and a strongly doped N-channel transistor (not shown) for reasons to be explained below. An inverter 40 has an input which receives a control signal labeled ResetB. ResetB is an active low signal which indicates a reset in a system in which fuse 32 is utilized. An output of inverter 40 is connected to an input of inverter 42. An output of inverter 42 is connected to an input of an inverter 44. An output of inverter 44 is connected to a first input of a logic NOR gate 46. NOR gate 46 has a second input for receiving the ResetB control signal. An output of NOR gate 46 is connected to the gate of N-channel transistor 34. A P-channel transistor 48 has a source connected to a $V_{DD}$ voltage terminal, a gate connected to receive the ResetB control signal, and a drain connected to node B. An inverter 50 has an input connected to the drain of transistor 48 at node B, and has an output which is connected to an input of an inverter 52. An output of inverter 52 is connected to an input of inverter 50. An inverter 54 has an input connected to the output of inverter 50, and has an output for providing a signal labeled "FUSE OUT" which indicates the conductivity status of fuse 32. In the illustrated form, the transistors are indicated to be MOS transistors. However, it should be readily apparent that other types of transistors as well as other conductivity implementations may be readily implemented. Additionally, it should be understood that any even number of inverters could be used in addition to inverters 36 and 38 as long as the last inverter utilizes a weakly doped P-channel transistor.

In operation, circuit 30 functions to provide an indication at the output of inverter 54 whether or not fuse 32 has been made nonconductive. In the illustrated form, inverters 36 and 38 and transistor 34 function to provide the same voltage potential across fuse 32 at nodes A and B if fuse 32 has been blown and made nonconductive. As a result of this operation, if fuse 32 is implemented as a copper fuse, no copper metal growth back of fuse 32 can occur after fuse 32 has been made nonconductive. To better understand the operation of circuit 30 reference will be made to the waveforms of FIG. 3.

Figure 3:
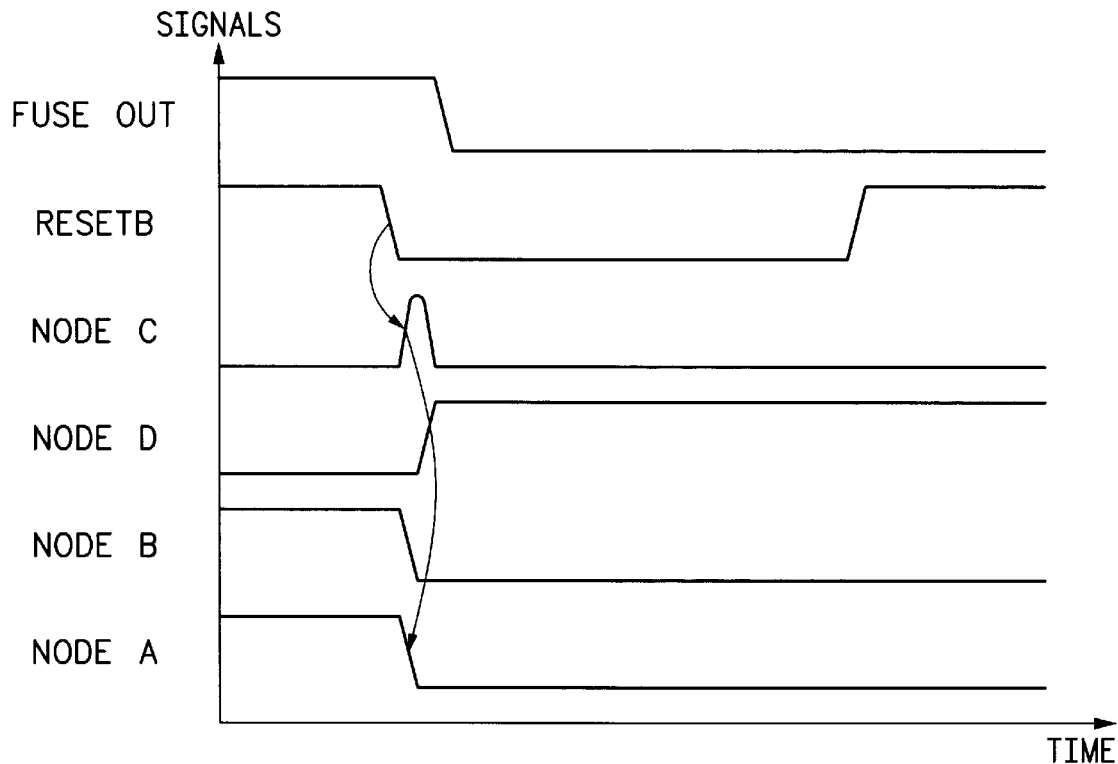
FIG. 3 illustrates, in graphical form, waveforms associated with the circuit of FIG. 2 before the fuse has been made non-conductive.

Illustrated in FIG. 3 are signals associated with the operation of fuse circuit 30 when fuse 32 is in an intact state and is still conductive. Initially assume that the ResetB control signal is in a logic high signal which is inactive for ResetB. In this state transistor 48 is non-conductive and transistor 34 is also non-conductive as the output of NOR logic gate 46 is a logic low. As a result, nodes A and B are at the same voltage potential which is illustrated as a logic high state but in fact can be any voltage between ground and $V_{DD}$ initially. Assuming that nodes A and B are at a logic high state, then the logic state of the FUSE OUT output signal is also a logic high signal. Now assume that the ResetB signal is made to transition from an inactive to an active state by moving to a logic low. Such a transition may occur at any point in time in the system which utilizes fuse circuit 30, as signal ResetB represents a system circuit reset signal which may occur at various times of operation in a system which utilizes fuse 32. In response to signal ResetB assuming a logic low, node C transitions to a logic high value for approximately three clock propagation delays which is the time required for signal ResetB to transition through inverters 40, 42 and 44. The logic high state of node C causes transistor 34 to become conductive and pull node A towards ground potential. Additionally, when signal ResetB is a logic low, transistor 48 is strongly conductive which places a potential of approximately $V_{DD}$ at node B. In response, the output of inverter 38 is also at $V_{DD}$. However as mentioned above, inverter 38 is implemented with a weak P-channel device and a strong N-channel device so that the coupling of $V_{DD}$ to node A is a weak coupling. The net effect of the combination of inverter 38 and transistor 34 is that the ground potential quickly overrides the weak $V_{DD}$ signal coupled by inverter 38 at node A, and node A transitions to ground quickly. Another way of saying the same thing is that transistor 34 overrides transistor 48. In this circuit operation, the FUSE OUT signal at the output of inverter 54 transitions from a logic high state to a logic low state. The logic low state is used to indicate that the fuse has not been blown. Initially in FIG. 3 the FUSE OUT signal, as well as nodes A and B, are assumed for illustration purposes only to have logic high values or a high impedance state. However, these states are not valid until the ResetB signal transitions from an inactive to an active state. The FUSE OUT signal is initially shown as being active (i.e. the fuse having been blown) only for purposes of illustrating a signal transition in the operation of the FUSE OUT signal once ResetB becomes active or valid and the valid internal states that result.

With the fuse circuit 10 of FIG. 1, it is possible that fuse 12 could be blown but reconnected through metal corrosion if fuse 12 is implemented as a copper fuse. In other words, the FUSE OUT signal may be a logic low (fuse conductive) even though it was considered that the FUSE OUT signal should be a logic high. The operation of the ResetB signal becoming active later would therefore indicate that the fuse is conductive through re-growth. Because the voltage potential at node A and node B is forced by inverters 36 and 38 to be essentially the same voltage potential, there is no possibility that the metal corrosion between node A and node B can occur even if fuse 32 is implemented as a copper fuse.

Figure 4:
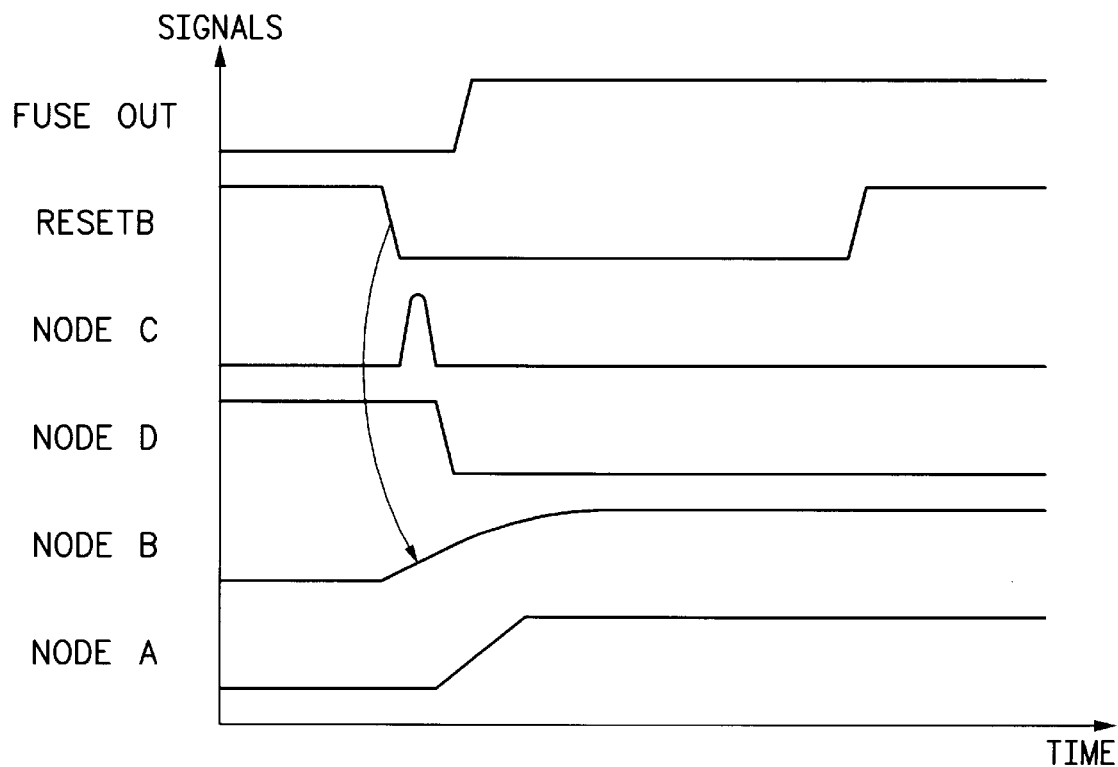
FIG. 4 illustrates, in graphical form, waveforms associated with the circuit of FIG. 2 after the fuse has been made nonconductive.

Assume now that circuit 30 operates in a blown state subsequent to fuse 32 having been blown either by a laser application or a sufficiently high voltage being applied across fuse 32. Illustrated in FIG. 4 are waveforms associated with fuse circuit 30 when the signal ResetB becomes active and the fuse 32 has been blown. Again it is initially assumed for purposes of illustration only that the FUSE OUT signal is a logic low and nodes A and B are also a logic low when the ResetB signal is inactive. If such signals remain in a logic low state after the ResetB signal becomes active, that would indicate that although the fuse 32 was thought to have been blown that its implementation to the blown state was unsuccessful. Referring to FIG. 4, assume that signal ResetB becomes active. In response, node C becomes a logic high thereby making transistor 34 conductive. Additionally, the transition of the ResetB signal makes transistor 48 conductive which makes node B rise to the $V_{DD}$ potential or a logic high. As node B becomes a logic high, and assuming that nodes A and B are no longer connected, the output of inverter 38 provides a $V_{DD}$ potential at node A.

However, node C starts to transition back to a ground potential after the active ResetB signal has transitioned through inverters 40, 42 and 44. Once a logic high signal reaches the first input of NOR logic gate 46, node C becomes logic low again. In response to the voltage at node C being at a logic low, transistor 34 is made nonconductive. As a result, the $V_{DD}$ potential at the output of inverter 38 makes node A substantially $V_{DD}$. It should be noted therefore that nodes A and B are both at the same voltage potential which is essentially a $V_{DD}$ potential. Additionally, the $V_{DD}$ potential at node B is coupled via inverters 50 and 54 to the FUSE OUT output signal which rises to a logic high. The logic high state of the FUSE OUT output signal indicates that the fuse 32 has been blown or made nonconductive. Inverters 50 and 52 function as a latch to make sure that the voltage state at node B is successfully latched at the input of inverter 54.

As a result of the operation which has been illustrated, it should be appreciated that there is no metal corrosion which can occur with fuse 32 because nodes A and B are substantially at the same voltage potential. It should be appreciated that various modifications to fuse circuit 30 can readily be made. One such modification would be to replace inverters 40, 42 and 44 and NOR logic gate 46 with a pulse generator circuit. In such an implementation a pulse would be provided at node C at the proper time to make transistor 34 conductive or nonconductive in accordance with the previously described circuit operation. Another modification of the present invention which may be readily applied would be to couple circuitry to the fuse 32 between nodes A and B so that nodes A and B are not exactly the same voltage potential but rather remain within a predetermined voltage differential or tolerance to inhibit any potential of metal corrosion in the growth back effect.

Figure 5:
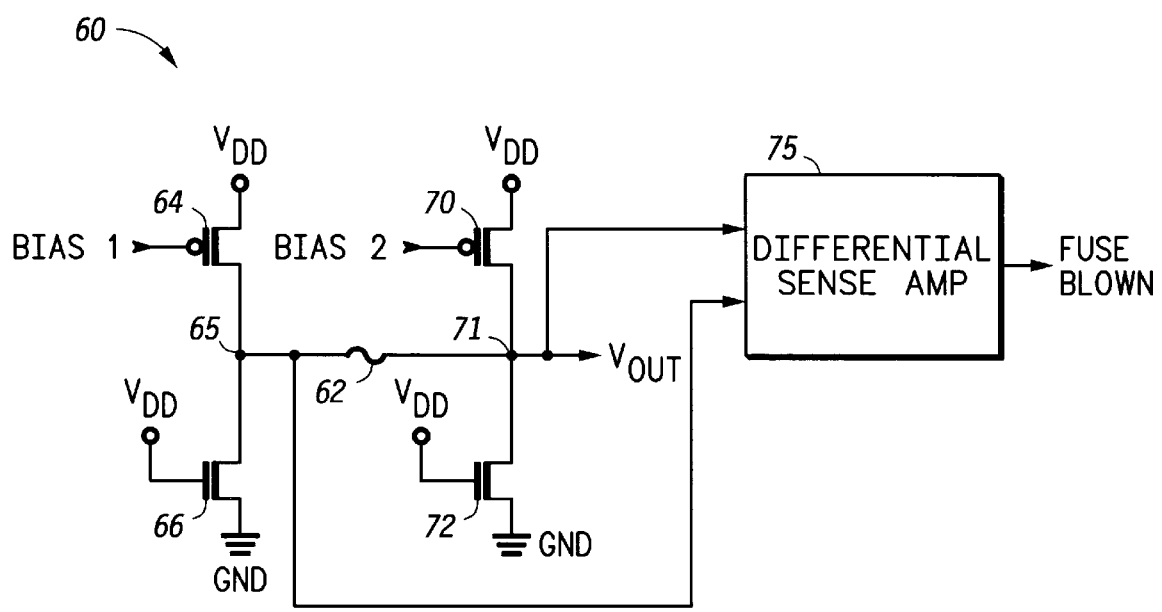
FIG. 5 illustrates, in partial schematic form, another embodiment of the fuse circuit in accordance with the present invention.

Illustrated in FIG. 5 is another embodiment of the present invention. A fuse circuit 60 has a fuse 62 which is connected between a node 65 and a node 71. A first bias circuit is connected to node 65. The first bias circuit has a P-channel transistor 64 and an N-channel transistor 66. Transistor 64 has a source connected to the supply voltage $V_{DD}$, a gate connected to bias voltage labeled "Bias 1", and a drain connected to node 65. Transistor 66 has a drain connected to node 65, a gate connected to supply voltage $V_{DD}$, and a source connected to the ground potential. A second bias circuit is connected to node 71. The second bias circuit has a P-channel transistor 70 which has a source connected to supply voltage $V_{DD}$, a gate connected to a second bias voltage labeled "Bias 2", and a drain connected to a node 71. An N-channel transistor 72 has a drain connected to node 71, a gate connected to supply voltage $V_{DD}$, and a source connected to the ground voltage potential. Node 71 provides an output voltage labeled "$V_{out}$" which may be used as a test voltage for reliability purposes or for other uses in the system which contains fuse 62. A differential sense amplifier 75 has a first input connected to node 71 and has a second input connected to node 65. An output of differential sense amplifier 75 provides a signal which indicates whether or not fuse 62 has been blown or made nonconductive.

In operation, fuse circuit 60 functions to place a predetermined bias voltage at node 65 and another predetermined bias voltage at node 71. In the illustrated form the bias circuit having transistors 64 and 66 is made a different strength than the bias circuit formed of transistors 70 and 72 so that a difference in the voltage applied at node 65 and 70 is permitted to exist. Based upon the strength of the Bias 1 voltage and the Bias 2 voltage, as well as the transistor strength ratios between the first and the second bias generators, a voltage differential will exist between nodes 65 and 71 when fuse 62 has been blown or made nonconductive. When fuse 62 is conductive and not blown, nodes 65 and 71 are at the same voltage potential. The value of that potential is determined by a number of factors, such as the transistor strength sizing as well as the bias signals to transistors 64 and 70. However, when fuse 62 is nonconductive, the voltage at node 65 will be different than the voltage at node 71 which creates an opportunity for differential sense amplifier 75 to indicate a difference in potential at these two nodes and therefore provide a "Fuse Blown" signal indicating that fuse 62 was successfully blown. By properly ratioing the two bias circuits, the voltage across fuse 62 at nodes 65 and 71 does not have to be made the same but may be made within a predetermined tolerance of voltage variability which is still permitted to avoid the metal corrosion effect of a copper implementation of fuse 62. It should be well understood that other variations may be used to avoid metal corrosion growth-back of a copper fuse by controlling the amount of voltage which is allowed to exist across a copper fuse once the fuse is blown. It has been determined that the amount of voltage which may exist across a copper fuse may be a predetermined minimal amount, such as 0.1 volt, without suffering the consequences of growth-back. The amount of variation is largely semiconductor process determinative.

By now it should be apparent that there has been provided an improved fuse circuit which avoids problems associated with copper fuses and potentially metal fuses of other metals. Additionally, a method for maintaining the voltage difference across a blown copper fuse in a semiconductor device to within a predetermined tolerance has been taught. As seen from the previously discussed waveforms, a first node of the fuse is set to a first voltage potential during a first time period, and a second node of the fuse is set to a second voltage potential during a second time period, wherein the first time period and the second time period are concurrent. The first node of the fuse is set to within a predetermined tolerance of the voltage potential at the second node after the first time period such that the voltage difference between the first node and the second node deters metal corrosion of the blown fuse.

Improvement in the reliability of assuredly blowing copper fuses has been accomplished. By controlling the voltage potential which exists at either terminal of a copper fuse once the copper fuse is blown, there is no longer metal corrosion associated with the copper fuse. The use of the present invention may be with memory redundancy, with processors utilizing memory, with identification techniques associated with the use of fuses or in other applications where fuses enjoy varied uses.

Although the present invention has been described with reference to a specific embodiment, further modifications and improvements will occur to those skilled in the art. For example, different voltage tolerances may be implemented across the copper fuse depending upon process and manufacturing parameters being used. Different circuitry may be used to provide the bias voltage to transistor 34 at node C than the circuitry illustrated; for example a pulse generator which is timed to provide a control signal or other circuitry which provides a bias voltage may be utilized. Differing numbers of inverter stages may also be used than the specific number illustrated. Also, the differential sense amplifier 75 of FIG. 5 does not have to be connected to each fuse terminal in order to sense a fuse voltage differential. For example, one input of the differential sense amplifier 75 may be coupled to a reference voltage and only one fuse terminal sensed. Accordingly, only at least one of the fuse terminals need to be sensed. Therefore, it is intended that this invention encompass all such variations and modifications as fall within the scope of the appended claims.

We claim:

1. A fuse circuit comprising:
   a fuse having an intact state and a blown state, the fuse being coupled between a first node and a second node; and
   a circuit coupled to the first node and the second node, wherein the circuit includes a portion that keeps the first node and the second node at substantially a same voltage potential in response to receiving a voltage signal at the first node of the fuse, the same voltage potential being kept across the fuse to deter corrosion of the fuse when in the blown state.

2. The fuse circuit of claim 1, wherein the first node and the second node are maintained at substantially the same voltage potential at all times when operating voltages are applied.

3. The fuse circuit of claim 1, wherein the fuse comprises copper.

4. A fuse circuit comprising:
   a fuse having an intact state and a blown state and coupled between a first node and a second node; and
   a circuit coupled to the first node and the second node, wherein the circuit includes a portion that maintains the first node and the second node at substantially a same voltage potential wherein the portion comprises a first inverter and a second inverter connected in series between the first node and the second node.

5. A fuse circuit comprising:
   a fuse having an intact state and a blown state and coupled between a first node and a second node:
   a circuit coupled to the first node and the second node, wherein the circuit includes a portion that keeps the first node and the second node at substantially a same voltage potential; and
   a latch circuit connected to the second node.

6. A fuse circuit comprising:
   a fuse having an intact state and a blown state and coupled between a first node and a second node; and
   a circuit coupled to the first node and the second node, wherein the circuit includes a portion that keeps the first node and the second node at substantially a same voltage potential, wherein the circuit further comprises a first transistor controlled by a first signal and having a first terminal connected to the first node and a second terminal connected to a first voltage potential, and a second transistor controlled by a second signal and having a first terminal connected to the second node and a second terminal connected to a second voltage potential.

7. The fuse circuit of claim 6, wherein the portion is stronger than the second transistor such that, if the fuse is in the intact state, the portion will maintain the second node at the first voltage potential.

8. The fuse circuit of claim 6, wherein the first and second signals are set to an enabling state concurrently and the first signal is set to a disabling state prior to the second signal being set to a disabling state such that the second transistor connects the second voltage potential to the second node for a period of time longer than the first transistor connects the first voltage potential to the first node.

9. The fuse circuit of claim 6, wherein the circuit comprises a pulse generating circuit coupled to the first transistor for generating the first signal.

10. The fuse circuit of claim 1, wherein the circuit comprises a first bias circuit coupled to the first node and a second bias circuit coupled to the second node, wherein the first bias circuit maintains the first node substantially at a first voltage potential and the second bias circuit maintains the second node substantially at a second voltage potential when the fuse is in the blown state, and wherein the second bias circuit maintains the first and second nodes substantially at the second voltage potential when the fuse is in the intact state.

11. The fuse circuit of claim 10, further comprising a differential sensing circuit connected to at least one of the first node or the second node, the differential sensing circuit detecting a voltage difference between the first node and the second node.

12. In a semiconductor device, a method of implementing a fuse which is selectively made nonconductive, comprising the steps of:
   providing a metal fuse between a first node and a second node;
   setting the first node to a first voltage potential during a first time period;
   setting the second node to a second voltage potential during a second time period, wherein the first time period and the second time period are concurrent; and
   maintaining voltage at the first node and the second node to within a predetermined minimal differential voltage value after the metal fuse is made nonconductive, such that the predetermined minimal differential voltage value between the first node and the second node is small enough to substantially deter metal corrosion of the metal fuse after the metal fuse is made nonconductive.

13. A fuse circuit in a semiconductor device, comprising:
   a fuse having an intact state and a blown state coupled between a first node and a second node; and
   a circuit coupled to the first node and the second node, wherein the circuit includes:
      a buffer circuit connected between the first node and the second node, wherein the buffer circuit maintains the first node at substantially a same voltage potential as the second node to within a predetermined tolerance, when the fuse is in the blown state;
      a first transistor controlled by a first signal and having a first terminal connected to the first node and a second terminal connected to a first voltage potential; and
      a second transistor controlled by a second signal and having a first terminal connected to the second node and a second terminal connected to a second voltage potential, wherein the first transistor is manufactured physically larger for more current drive capability than the second transistor and the buffer circuit, such that voltage at the first node and the second node are approximately equal to the first voltage potential when the fuse is in the intact state.

14. The fuse circuit of claim 13, wherein the fuse comprises copper.

15. The fuse circuit of claim 13, wherein the first signal and the second signal occur concurrently such that, after an occurrence of at least one of the first signal and the second signal, the second node is set to the first voltage potential if the fuse is in the intact state and is set to the second voltage potential if the fuse is in the blown state.

16. The fuse circuit of claim 13, wherein the fuse circuit comprises a latch circuit connected to the second node.

17. The fuse circuit of claim 13, wherein the buffer circuit comprises a first inverter and a second inverter connected in series.

18. The fuse circuit of claim 13, wherein the first and second signals are set to an enabling state concurrently and the first signal is set to a disabling state prior to the second signal being set to a disabling state such that the second transistor connects the second voltage potential to the second node for an amount of time which is longer than the first transistor connects the first voltage potential to the first node.

19. The fuse circuit of claim 13, wherein the circuit comprises a pulse generating circuit that receives the second signal and coupled to the first transistor for generating the first signal.

20. The fuse circuit of claim 13, wherein the fuse is a metal fuse and the predetermined tolerance is selected to deter corrosion of the metal fuse.

* * * * *